United States Patent
Kang

(10) Patent No.: US 8,416,639 B2
(45) Date of Patent: Apr. 9, 2013

(54) MULTI-CHIP PACKAGE AND METHOD OF OPERATING THE SAME

(75) Inventor: Won Kyung Kang, Seoul (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 13/176,812

(22) Filed: Jul. 6, 2011

(65) Prior Publication Data

US 2012/0008360 A1    Jan. 12, 2012

(30) Foreign Application Priority Data

Jul. 9, 2010  (KR) .................. 10-2010-0066609

(51) Int. Cl.
*G11C 8/00* (2006.01)
(52) U.S. Cl. ............... 365/239; 365/51; 365/230.03; 365/225.7
(58) Field of Classification Search ............ 365/51, 365/225.7, 230.03, 239
See application file for complete search history.

(56) References Cited

U.S. PATENT DOCUMENTS

| 2006/0106951 A1* | 5/2006 | Bains ........................ 710/5 |
| 2009/0027939 A1* | 1/2009 | Kang ........................ 365/51 |
| 2009/0323440 A1* | 12/2009 | Soma .................. 365/189.15 |

FOREIGN PATENT DOCUMENTS

| KR | 1020040081449 A | 9/2004 |
| KR | 1020090010473 A | 1/2009 |

* cited by examiner

*Primary Examiner* — Hoai V Ho
*Assistant Examiner* — Jay Radke
(74) *Attorney, Agent, or Firm* — William Park & Associates Ltd.

(57) ABSTRACT

A multi-chip package includes a plurality of memory chips for performing a content addressable memory (CAM) read operation in response to a command signal for the CAM read operation and an address signal for selecting the memory chips and a controller for outputting the command signal and the address signal to the memory chips and controlling the sequence of the CAM read operations for the memory chips.

14 Claims, 5 Drawing Sheets

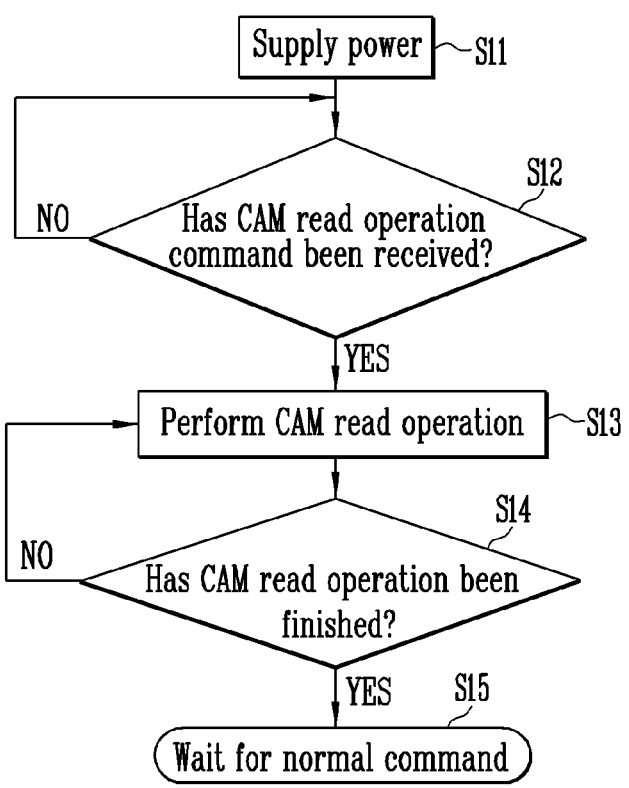

200

200

320

MULTI-CHIP PACKAGE AND METHOD OF OPERATING THE SAME

CROSS-REFERENCE TO RELATED APPLICATION

Priority to Korean patent application number 10-2010-0066609 filed on Jul. 9, 2010, the entire disclosure of which is incorporated by reference herein, is claimed.

BACKGROUND

Exemplary embodiments relate generally to a memory package and a method of operating the same and, more particularly, to a multi-chip package performing a code access memory (CAM) read operation and a method of operating the same.

In order to operate memory packages, power must be supplied to the memory packages.

When power is supplied, a firmware is first loaded into a controller, and then a booting process is performed. Here, the firmware is read from a memory chip if the firmware is stored in the memory chip.

Meanwhile, recent semiconductor memory devices use CAM instead of a fuse. In order to operate the memory chip, a CAM read operation is performed.

Accordingly, the CAM read operation may be first performed in the memory chip during a booting process.

FIG. 1 is a flowchart illustrating the CAM read operation of a known multi-chip package.

Referring to FIG. 1, the CAM read operation of the known multi-chip package is described below.

Power is supplied to the package at step S11. A command, instructing the execution of the CAM read operation is inputted to a memory chip at step S12.

The CAM read operation is performed in response to the command at step S13.

In the case of multi-chip packages such as DDP (Dual Die Package), QDP (Quad Die Package), and ODP (Octal Die Package) with 1CE (1 Chip Enable), the CAM read operations are performed on a plurality of memory chips, e.g., stacked memory chips at the same time.

After the CAM read operation is performed, it is checked whether the CAM read operation has been finished at step S14.

If, as a result of the check, the CAM read operation has been finished, the package waits for a normal command. If, as a result of the check, the CAM read operation has not been finished, the package maintains the CAM read operation.

The CAM read operation is similar to a normal read operation. That is, when the CAM read operation for several chips is performed at the same time, relevant current consumption may increase. Therefore, technology for reducing/minimizing the current consumption during the booting process of the multi-chip packages is important.

BRIEF SUMMARY

Exemplary embodiments relate to a multi-chip package and a method of operating the same, which are capable of reducing booting current consumed in CAM read operations for memory chips by selectively performing the CAM read operations.

A multi-chip package according to an aspect of the present disclosure includes a plurality of memory chips for performing a code access memory (CAM) read operation in response to a command signal for the CAM read operation and an address signal for selecting the memory chips and a controller for outputting the command signal and the address signal to the memory chips and controlling the sequence of the CAM read operations for the memory chips.

A method of operating a multi-chip package according to another aspect of the present disclosure includes inputting an address signal for selecting one of memory chips and a command signal for the CAM read operation of the selected memory chip to the memory chips and sequentially performing the CAM read operations for the memory chips.

BRIEF DESCRIPTION OF THE DRAWINGS

FIG. 1 is a flowchart illustrating the CAM read operation of a known multi-chip package.

DESCRIPTION OF EMBODIMENTS

Hereinafter, some exemplary embodiments of the present disclosure will be described in detail with reference to the accompanying drawings. The figures are provided to allow those having ordinary skill in the art to understand the scope of the embodiments of the disclosure.

Figure 2A:
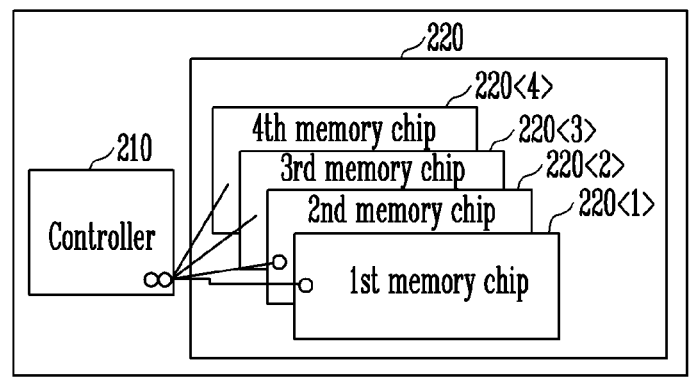
FIGS. 2A and 2B are a plan view and a perspective view showing a multi-chip package according to an embodiment of this disclosure.
Figure 2B:
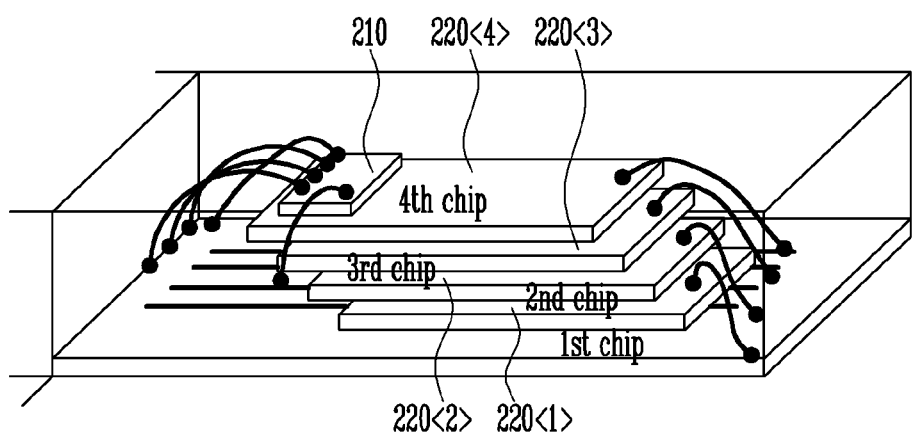

FIGS. 2A and 2B are a plan view and a perspective view showing a multi-chip package according to an embodiment of this disclosure.

Referring to FIGS. 2A and 2B, the multi-chip package 200 according to the embodiment of this disclosure includes a controller 210 and a plurality of memory chips 220<1> to 220<4>.

In the present embodiment, an example in which the multi-chip package 200 includes the four memory chips 220<1> to 220<4> is illustrated. However, the multi-chip package 200 may include more memory chips and the number of memory chips is not specially limited.

According to an example, the memory chips 220<1> to 220<4> have a stack form. The controller 210 is electrically coupled to the memory chips.

In the multi-chip package 200 according to the embodiment of this disclosure, the controller 210 may play a role of an interface between the memory chips when the memory chips have different address input methods.

The controller 210 outputs an address for selecting each of the memory chips 220<1> to 220<4> and a command for the CAM read operation of the selected memory chip to each of the memory chips 220<1> to 220<4>. The controller 210 also controls the sequence of the CAM read operations of the memory chips 220<1> to 220<4>.

Each of the memory chips 220<1> to 220<4> receives the address before receiving the command or receives the address and the command at the same time from the controller 210, so that the CAM read operation is preformed in a selected memory chip. A command sequence and a number of address cycle may vary. In the embodiment of this disclosure, it is assumed that an address of one cycle is received.

That is, each of the memory chips 220<1> to 220<4> may receive the address of one cycle before the command for the CAM read operation is received. The CAM read operation is selectively performed according to the address (for example, an address 00h: No. 1 die, an address 01h: No. 2 die, and an address 02h: No. 3 die).

Figure 3:
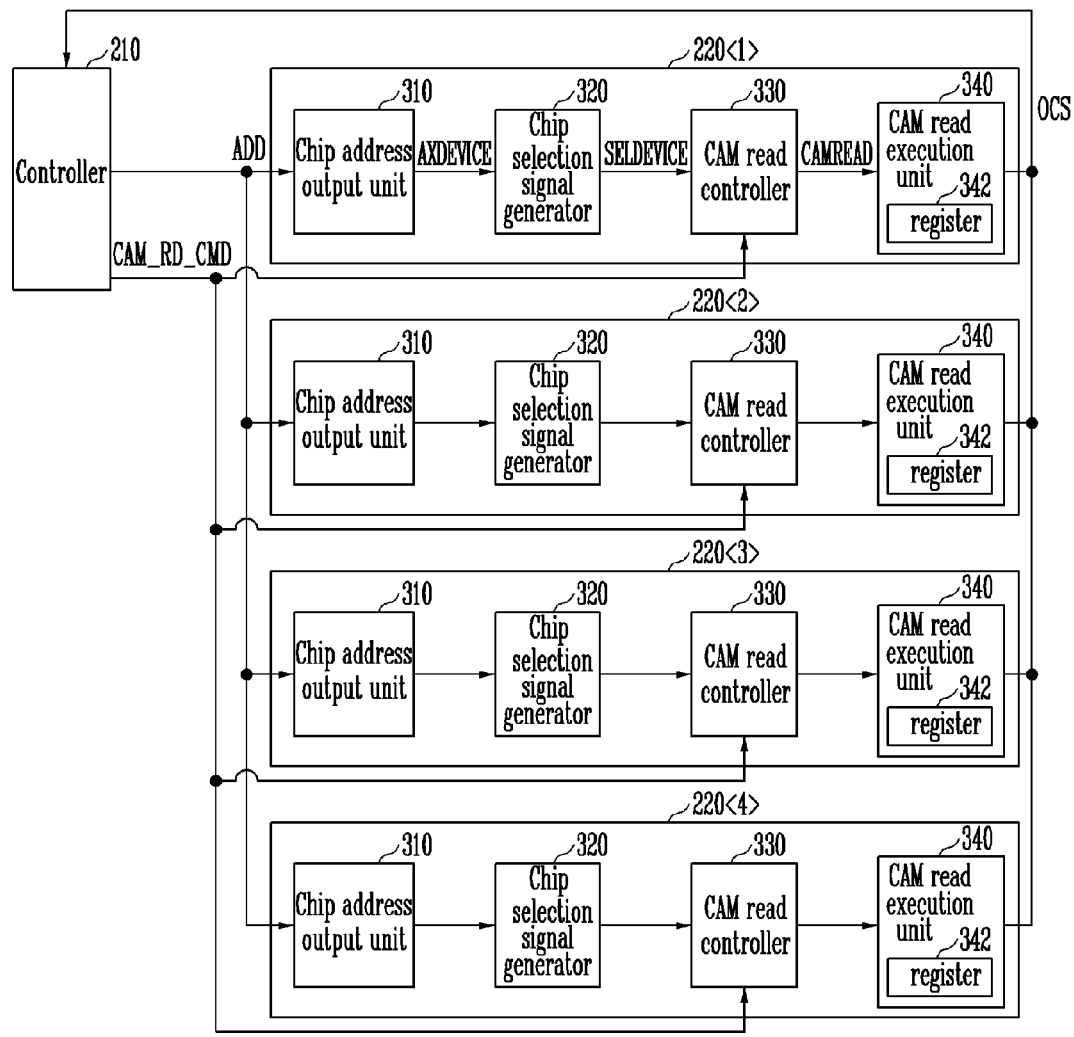
FIG. 3 is a block diagram showing a detailed configuration of a memory chip shown in FIG. 2.

FIG. 3 is a block diagram showing a detailed configuration of the memory chip shown in FIG. 2.

The memory chip comprises circuits for selectively performing the CAM read operation according to the address received from the controller 210.

To this end, each of the memory chips 220<1> to 220<4> of the multi-chip package according to the embodiment of this disclosure includes a chip address output unit 310, a chip selection signal generator 320, a CAM read controller 330, and a CAM read execution unit 340.

In the present embodiment, the CAM read operation for each of the memory chips is separately performed, e.g., sequentially performed. Meanwhile, the memory chip of the present embodiment may include the circuits for performing the same operation as a known memory chip. Accordingly, the configuration of circuits for a normal operation is not described.

The chip address output unit 310 receives an address signal ADD from the controller 210 and outputs an address (that is, a chip address signal AXDEVICE) for selecting a memory chip.

The address signal ADD received from the controller 210 may include a plurality of addresses, such as a column address, a page address, a block address, and a chip address, according to purposes.

The chip address output unit 310 selects a chip address for selecting a memory chip from the several addresses. Also, the chip address output unit 310 may store the chip address.

The chip selection signal generator 320 generates a selection signal SELDEVICE, indicating whether a corresponding memory chip has been selected, based on the chip address signal AXDEVICE received from the chip address output unit 310. That is, when the received chip address signal is identical with an address of the corresponding memory chip, the chip selection signal generator 320 generates a selection signal SELDEVICE.

The CAM read controller 330 receives the selection signal SELDEVICE from the chip selection signal generator 320 and a CAM read command signal CAM_RD_CMD from the controller 210 and, when the corresponding memory chip is a selected memory chip, generates a CAM read operation signal CAMREAD.

The CAM read execution unit 340 performs a CAM read operation in response to the CAM read operation signal CAMREAD received from the CAM read controller 330.

The CAM read operation may be performed like a normal read operation except that it is performed only for a CAM cell. Accordingly, a description of the CAM read operation is omitted.

The CAM read execution unit 340 checks whether the CAM read operation has been completed and stores the result of the check in a register 342. If the CAM read operation has been completed, the CAM read execution unit 340 outputs a CAM read operation-completed signal (OCS) to the controller 210.

When the CAM read operation-completed signal OCS is received, the controller 210 checks that the CAM read operation has been completed in a state circuit and outputs the address of a memory chip for a next CAM read operation.

Detailed configurations of the chip address output unit 310, the chip selection signal generator 320, and the CAM read controller 330 are described below.

Figure 4:
FIG. 4 is a block diagram showing a detailed configuration of a chip selection signal generator shown in FIG. 3.

FIG. 4 is a block diagram showing a detailed configuration of the chip selection signal generator 329 shown in FIG. 3.

Referring to FIG. 4, the chip selection signal generator 320 includes a selection signal generation block STACK_LOGIC. The selection signal generation block STACK_LOGIC generates the selection signal SELDEVICE, indicating whether the memory chip has been selected, based on the chip address signal AXDEVICE received from the chip address output unit 310.

First to third input signals are inputted to the selection signal generation block STACK_LOGIC. The first input signal is the chip address signal AXDEVICE. The chip address signal AXDEVICE is received from the chip address output unit 310. The second input signal FB and the third input signal IE are fixed and determined according to bonding options upon packaging. Each of the second input signal FB and the third input signal IE functions to indicate that a specific memory chip corresponds to any one of memory chips (that is, the location of the specific memory chip).

For example, when the chip address signal AXDEVICE for a first memory chip is received from the chip address output unit 310, the first memory chip in which each of the second input signal FB and the third input signal IE is set in the first place outputs the selection signal SELDEVICE.

Figure 5A:
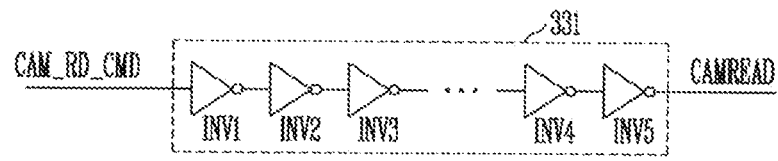
FIG. 5A is a circuit diagram of a CAM read controller of a known multi-chip package.
Figure 5B:
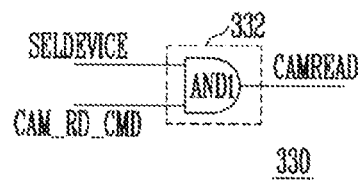
FIG. 5B is a block diagram showing a detailed configuration of a CAM read controller shown in FIG. 3.

FIG. 5A is a circuit diagram of the CAM read controller of a known multi-chip package, and FIG. 5B is a block diagram showing a detailed configuration of the CAM read controller 330 shown in FIG. 3.

Referring to FIG. 5A, the CAM read controller of the known multi-chip package outputs the CAM read command signal CAM_RD_CMD as the CAM read operation signal CAMREAD via a buffer circuit 331.

Accordingly, when the CAM read controller of the multi-chip package inputs the CAM read operation command CAM_RD_CMD to a plurality of memory chips, all the memory chips perform CAM read operations at the same time.

Referring to FIG. 5B, the CAM read controller 330 included in the memory chip of the multi-chip package according to the embodiment of this disclosure generates the CAM read operation signal CAMREAD for performing a CAM read operation by combining the CAM read command signal CAM_RD_CMD and the selection signal SELDEVICE.

To this end, the CAM read controller 330 includes a command processor 332.

The command processor 332 may include a logic element AND1 to which the CAM read command signal CAM_RD_CMD received from the controller 210 and the selection signal SELDEVICE received from the chip selection signal generator 320 are inputted.

The command processor 332 may be implemented using, for example, an AND gate.

Each of memory chips generates the CAM read command signal CAM_RD_CMD of a high level.

Only a memory chip selected from among a plurality of memory chips generates the selection signal SELDEVICE of a high level, and unselected memory chips maintain the selection signal SELDEVICE of a low level.

The CAM read operation signal CAMREAD of a high level is generated only when both the CAM read command signal CAM_RD_CMD and the selection signal SELDE- VICE have a high level. That is, only when a specific memory chip is selected according to a chip address, a CAM read operation is performed.

In other words, the CAM read operation may be selectively performed by a combination of the existing command CMD and an address.

A CAM read operation in the multi-chip package configured as above is described below.

Figure 6:
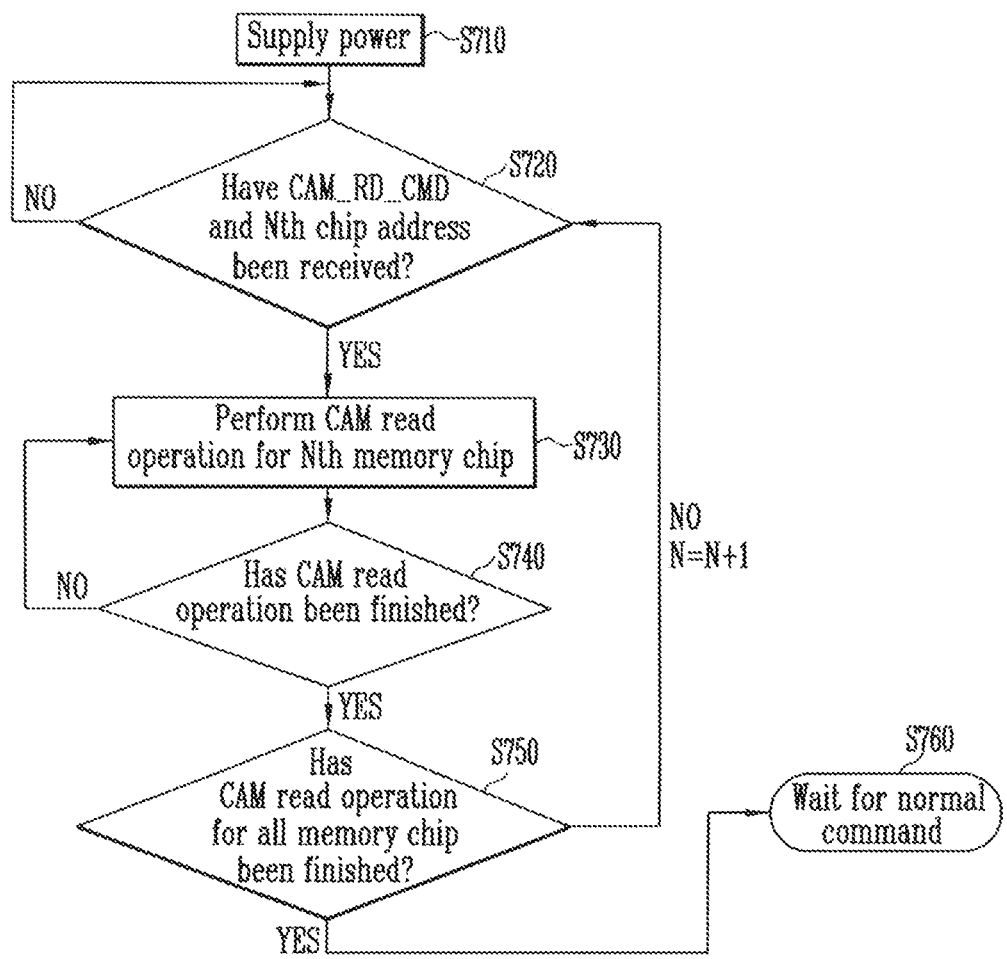
FIG. 6 is a flowchart illustrating the CAM read operation of the multi-chip package according to an embodiment of this disclosure.

FIG. 6 is a flowchart illustrating the CAM read operation of the multi-chip package according to an embodiment of this disclosure.

Referring to FIG. 6, in the CAM read operation according to the present embodiment, when power is supplied at step S710, the command CAM_RD_CMD, instructing the execution of the CAM read operation, and a chip address, indicating the CAM read operation for an $N^{th}$ memory chip, are received at step S720. The command CAM_RD_CMD and the chip address may be received at the same time, or the chip address may be received before the command CAM_RD_CMD is received.

The CAM read operation for the $N^{th}$ memory chip is performed according to the chip address at step S730.

It is checked whether the CAM read operation has been finished at step S740. If, as the result of the check, the CAM read operation has not been finished, the CAM read operation maintains.

If, as the result of the check, the CAM read operation has been finished, it is checked whether the CAM read operation for all memory chips has been finished at step S750.

If, as the result of the check, the CAM read operation for all the memory chips has not been finished, the CAM read operation for a next memory chip (that is, an $(N+1)^{th}$ memory chip) is performed. If, as the result of the check at step S750, the CAM read operations for all the memory chips have been finished, the memory chips wait for a normal command at step S760.

The CAM read operations for the memory chips may be sequentially performed. That is, after the CAM read operation for a first memory chip is finished, the CAM read operation for a second memory chip to the CAM read operation for an $N^{th}$ memory chip may be sequentially performed.

In some embodiments, the CAM read operations may be performed according to a specific sequence not a sequential manner. The specific sequence may be changed according to the sequence of chip addresses received from the controller 210.

An example in which one memory chip is selected has been described in the present embodiment, but one or more memory chips may be selected at the same time. In this case, the CAM read operations may be overlappingly performed among the memory chips.

As described above, the CAM read operations for memory chips are not performed at the same time, but separately and selectively performed. Accordingly, booting current consumed to perform the CAM read operations may decrease.

The embodiments of this disclosure may be applied to, e.g., SD, MMC, and SSD in which booting current is important.

In the embodiment of this disclosure, in a multi-chip package including memory chips, the CAM read operations for the memory chips are selectively performed. Accordingly, booting current and excessive current consumption may decrease, as compared with a case where the CAM read operations for the memory chips are performed at the same time.

The total current consumption may be the same in the known art and in the method of this disclosure. However, from a viewpoint of an average current, current consumption may decrease.

The exemplary embodiments of this disclosure are not implemented using only the apparatus and the method, but may be implemented using a program for realizing functions corresponding to the configuration of the exemplary embodiment of this disclosure or a recording medium in which the program is stored. The implementations may be readily realized by a person having ordinary skill in the art from the description of the exemplary embodiments.

What is claimed is:

1. A multi-chip package, comprising:
a plurality of memory chips configured to perform a code access memory (CAM) read operation in response to a command signal for the CAM read operation and an address signal for selecting the memory chips; and
a controller configured to output the command signal and the address signal to the memory chips when a booting operation is performed and control a sequence of the CAM read operations for the memory chips.

2. The multi-chip package of claim 1, wherein each of the memory chips comprises:
a chip address output unit configured to select a chip address signal for the corresponding memory chip from the address signal and outputting the chip address signal;
a chip selection signal generator configured to generate a selection signal, indicating that the corresponding memory chip for which the CAM read operation will be performed has been selected, in response to the chip address signal;
a CAM read controller configured to generate a CAM read operation signal, instructing the CAM read operation to be performed in the relevant memory chip, based on the selection signal and the command signal; and
a CAM read execution unit configured to perform the CAM read operation in response to the CAM read operation signal.

3. The multi-chip package of claim 2, wherein the chip selection signal generator receives a signal indicative of a sequence of the relevant memory chip within the multi-chip package.

4. The multi-chip package of claim 2, wherein the CAM read controller comprises a logic element configured to generate the CAM read operation signal in response to the selection signal and the command signal.

5. The multi-chip package of claim 2, wherein:
the CAM read execution unit generates an operation-completed signal when the CAM read operation is finished, and
the controller generates an address signal for a next memory chip in response to the operation-completed signal.

6. The multi-chip package of claim 1, wherein the controller controls a sequence of the CAM read operations for the memory chips by changing an output order of the address signal.

7. A method of operating a multi-chip package, comprising:
inputting an address signal for selecting one of memory chips and a command signal for a code access memory (CAM) read operation of the selected memory chip to the memory chips when a booting operation is performed;
performing the CAM read operation of the selected memory chip; and
repeating the steps of inputting and performing until a CAM operation of all the memory chips is completed.

8. The method of claim 7, wherein the address signal is changed to select another memory chip on which a CAM read operation will be performed after a CAM read operation of one memory chip is performed.

9. The method of claim 7, further comprising generating a selection signal, indicating one of the memory chips has been selected according to the address signal, when the address signal is inputted to the memory chips.

10. The method of claim 9, wherein the CAM read operation is performed in the selected memory chip in response to the command signal and the selection signal.

11. The method of claim 10, wherein the CAM read operation is performed when the command signal and the selection signal have a high level.

12. The method of claim 7, wherein the command signal and the address signal are simultaneously inputted.

13. The method of claim 7, wherein the address signal is inputted before inputting the command signal.

14. The method of claim 8, wherein CAM read operations are performed in an order in which the address signal is changed.

* * * * *